United States Patent
Hubička et al.

(10) Patent No.: US 11,651,937 B2
(45) Date of Patent: May 16, 2023

(54) METHOD OF LOW-TEMPERATURE PLASMA GENERATION, METHOD OF AN ELECTRICALLY CONDUCTIVE OR FERROMAGNETIC TUBE COATING USING PULSED PLASMA AND CORRESPONDING DEVICES

(71) Applicant: FYZIKALNI USTAV AV CR, V.V.I, Prague (CZ)

(72) Inventors: Zdeněk Hubička, Prague (CZ); Martin Čada, Prague (CZ); Petra Kšírová, Prague (CZ); Miloslav Klinger, Prague (CZ)

(73) Assignee: FYZIKALINI USTAV AV CR, V.V.I., Prague (CZ)

( * ) Notice: Subject to any disclaimer, the term of this patent is extended or adjusted under 35 U.S.C. 154(b) by 0 days.

(21) Appl. No.: 17/086,414

(22) Filed: Nov. 1, 2020

(65) Prior Publication Data

US 2021/0050181 A1    Feb. 18, 2021

Related U.S. Application Data

(63) Continuation of application No. PCT/CZ2019/050019, filed on May 2, 2019.

(30) Foreign Application Priority Data

May 2, 2018   (CZ) .................................. CZ2018-206
Aug. 8, 2018   (LU) ........................................ 100893

(51) Int. Cl.
*H01J 37/32*    (2006.01)
*C23C 14/04*    (2006.01)
*C23C 14/34*    (2006.01)

(52) U.S. Cl.
CPC ...... *H01J 37/32027* (2013.01); *C23C 14/046* (2013.01); *C23C 14/3407* (2013.01);
(Continued)

(58) Field of Classification Search
None
See application file for complete search history.

(56) References Cited

U.S. PATENT DOCUMENTS 6,081,414 A * 6/2000 Flanigan ........... H01J 37/32532
279/128
6,117,279 A * 9/2000 Smolanoff ........ H01J 37/32477
204/192.12

(Continued)

FOREIGN PATENT DOCUMENTS

CZ    2016455 A3    8/2017
WO    2012142038 A1   10/2012

OTHER PUBLICATIONS

Z. Hubicka et al: "Deposition of hematite Fe2O3 thin film by DC pulsed magnetron and DC pulsed hollow cathode sputtering system", Thin Solid FI LMS, vol. 549, Dec. 1, 2013 (Dec. 1, 2013), pp. 184-191, XP055581293, Amsterdam, NL ISSN: 0040-6090, DOI: 10.1016/j.tsf.2013.09.031.

*Primary Examiner* — Jason Berman
(74) *Attorney, Agent, or Firm* — Michael D. Eisenberg

(57) ABSTRACT

The present invention resides in the unifying idea of synchronizing a positive voltage pulse supplied to an electrically conductive or ferromagnetic tube and a exciting negative voltage pulse on a hollow cathode induced on the background of a high-frequency capacitive discharge.

In one embodiment, the invention relates to a method of generating low-temperature plasma in a vacuum chamber comprising a hollow cathode and an electrode, the method comprising the step of igniting the pulsed DC discharge in the hollow cathode wherein the positive voltage pulse at (Continued)

least partially overlaps with the negative voltage pulse, and the positive voltage pulse at least partially overlaps with the negative voltage pulse on the hollow cathode.

In another embodiment, the present invention relates to a method of coating the inner walls of hollow tubes which utilizes the above-mentioned low-temperature plasma generation process.

In another embodiment, the invention relates to a low-temperature plasma generating device comprising a hollow cathode located in the vacuum chamber, a RF plasma source, a pulse DC burst source, and a bipolar pulse source.

In another embodiment, an object of the invention is an apparatus adapted to coat the inner sides of hollow tubes comprising a low-temperature plasma generating device.

9 Claims, 4 Drawing Sheets

(52) U.S. Cl.
CPC .... *C23C 14/3485* (2013.01); *H01J 37/32045* (2013.01); *H01J 37/32091* (2013.01); *H01J 37/32394* (2013.01); *H01J 37/32596* (2013.01); *H01J 2237/002* (2013.01); *H01J 2237/332* (2013.01)

(56) References Cited

U.S. PATENT DOCUMENTS

| | | | |
|---|---|---|---|
| 2004/0255863 A1* | 12/2004 | Higashiura | H01J 37/32082 118/723 E |
| 2006/0196419 A1 | 9/2006 | Tudhope et al. | |
| 2007/0256926 A1 | 11/2007 | Delahoy et al. | |
| 2008/0271779 A1* | 11/2008 | Miller | B22F 1/052 204/192.12 |
| 2009/0045047 A1* | 2/2009 | Chiang | H01J 37/342 204/192.15 |
| 2011/0045208 A1* | 2/2011 | Ohtake | C23C 16/042 118/723 E |
| 2011/0278157 A1* | 11/2011 | Rudigier | H01J 37/32064 204/192.38 |
| 2012/0258260 A1* | 10/2012 | Michel | C23C 16/507 118/723 E |

* cited by examiner

METHOD OF LOW-TEMPERATURE PLASMA GENERATION, METHOD OF AN ELECTRICALLY CONDUCTIVE OR FERROMAGNETIC TUBE COATING USING PULSED PLASMA AND CORRESPONDING DEVICES

This application is the continuation of International Application No. PCT/CZ2019/050019, filed 2 May 2019, which claims the benefit of Czech patent application PV 2018-206, filed 2 May 2018, and Luxembourg patent application LU 100893, filed 8 Aug. 2018, the entire contents of which are hereby incorporated by reference.

FIELD OF THE INVENTION

The present invention relates to the technical field of low-temperature plasma generation and preparation of a thin film using plasma or plasma-chemical method. In some aspects, the present invention concerns a method of a thin film deposition, wherein the film is high adhesive and high dense, into difficulty available space of electrically conductive or ferro-magnetic machine parts and component, in particularly on inner surface of narrow hollow metal tubes.

STATE OF THE ART

It has been disclosed a lot of methods and devices for plasma coating of difficultly available space of machine part and components, in particularly on inner surface of hollow substrates, more particularly on inner surface of narrow hollow tubes.

Basic known method is disclosed in patent document: J. Meng, X. T Yang, J. H. Zhang, W S. Yang, D. Z. Guo, Z. J. Cockeyed, Y. G. Zhao, S. J. Whoa, C. Luo, Research of TiZrV Pumping Coatings he the Inner Walls of Vacuum Chamber Physics Procedia 32 (2012) 865-868, where a classical planar cylindrical direct-current magnetron placed inside a tube is used, wherein the tube is coated by a thin film by sputtering of the magnetron cathode. This method has particular limitation in minimum size of coated tube diameter.

A better method for tube's inner part coating is described in patent document CZ 305631: V. Rouček, J. Bulíř, J. Lančok, M. Novotný, "Zařízeni pro povlakování vnitřních dutin malého příčného průřezu a velkých podélných rozměrů metodou magnetronového naprašování", where is achieved coated tube size reduction. The document discloses a cylindrical sputtering cathode placed inside a tube and source of magnetic field for magnetron discharge is placed outside the tube. This configuration has some drawbacks in that, the coating of a tube from ferro-magnetic material is not possible.

The above-mentioned problem is overcome and the solution is described in patent document CZ 283407: Způsob a zařízení pro vytváření povlaku na vnitřních stěnách dutých substrátů, zejména trubic. In a system described in the document, a radiofrequency plasma jet generator is placed into a coated tube, wherein, inside the jet generator, a high-frequency discharge is generated in a hollow cathode. Using said discharge, particles of material are sputtered which subsequently cover an electrically ground inner side of the coated tube after the deposition on a substrate. One of the disadvantages of the solution is low energy of the sputtered particles creating a thin film and their low degree of ionisation which provides worse adhesion and density of the deposited film.

Another method how to increase sputtered particles energy during coating of tube's inner surface is described in patent document: T. Kraus, J. Keckes, J. K. N. Lindner, W. Ensinger and B. Stritzker, *Coating The Inner Walls Of Tubes With TiN Films By Reactive Sputtering, AIP Conference Proceedings* 680, 830 (2003). In this set-up, ionic sputtering of a cone target was used, wherein the target is placed inside the coated tube. Ionic beam having high kinetic energy is entering the tube by an opening from an exterior ion source. Disadvantage of said method is small deposition rate. However, as it was discussed above, using direct or high-frequency discharge in a hollow cathode, similar to a jet inserted inside the coated tube, is possible with advantage of coating of tube's inner surface.

Direct (DC) discharge used as the source of sputtered particles for deposition of films in a hollow cathode is described for example in patent document U.S. Pat. No. 3,830,721: D. M. Gruen at. al. HOLLOW CATHODE SPUTTERING DEVICE. In this work, a hollow cathode in the form of a nozzle is sputtered by a direct (DC) discharge in a hollow cathode. However, the present invention has some drawbacks, which consist, for example, in solving the construction of an anode which is in the form of a wire located inside the space of the hollow cathode, thus limiting the length of its own hollow cathode. The wire anode, which must have a defined minimum diameter for the discharge current, is further limited by the smallest possible diameter of the hollow cathode and its lifetime in the intensive DC discharge when sputtering the cathode material. The document does not further address the coating of long tubes on their inner surface where the film would have good adhesion and high density.

High-frequency discharge in hollow cathode is described in patent document U.S. Pat. No. 4,637,853 B. Bumble, J. Cuomo, J. Logan, S. Rossnagel, *HOLLOW CATHODE ENHANCED PLASMA FOR HIGHRATE REACTIVE ON ETCHING AND DEPOSITON.*

In this work, a high frequency discharge in a hollow cathode is used for fast reactive deposition of thin films and ionic reactive plasma etching of electrically nonconducting materials. However, the present invention has the drawbacks that, in view of the hollow cathode construction is in the described system which cannot be used to coat the inner space of long thin tubes with a thin film of good adhesion and high density.

DC pulse discharge in hollow cathode, applied in a method of thin reactive sputtering, is described in patent application US 2007/0256926: A. E. Delahoy, S Guo, HOLLOW CATHODE SPUTTERING APPARATUS AND RELATED METHOD. However, the present invention has the drawbacks, that in view of the construction of the hollow cathode and the corresponding anode for an intensive sputtering DC discharge, it is not possible to use the described system to coat the interior of long thin ferromagnetic tubes to form a high density thin film with good adhesion on its inner surface.

Deposition system using radiofrequency (RF) discharge in a hollow cathode, where the hollow cathode is configured so that it forms a jet and the RF discharge is pulse-modulated and a device is used for reactive deposition of a perovskite thin film is described in a document of a utility model CZ 17135 Z. Hubička, J. Olejníček, P. Virostko, M. Čada, L. Jastrabík, O. Churpita, G. Suchaneck, A. Dejneka, M. Hrabovský, Systém pro realizaci perovskitových tenkých vrstev.

The deposition of thin oxide films by a hybrid system with a hollow-cathode in shape of jet, where the hollow cathode was sputtered by a DC pulse generator which was parallel to the RF generator, is described in a non-patent document: Z. Hubička, Š. Kment, J. Olejníček, M. Čada, T. Kubart, M. Brunclíková, P Kšírová, P Adámek, Z. Remeš, *Deposition of hematite Fe2O3 thin film by DC pulsed magnetron and DC pulsed hollow cathode sputtering system*, Thin Solid Films 549 (2013) 184-191.

It is an objection of the present invention to introduce a novel and effective method of generation low-temperature plasma in a hollow cathode, method of pulse plasma coating of electrically conductive or ferro-magnetic tubes by a thin film, a device for generation low-temperature plasma and a device for plasma generation of a thin film having high adhesion and density deposited on an inner surface of a narrow elongated electrically conductive or ferro-magnetic tube.

DISCLOSURE OF THE INVENTION

The above mentioned technical problem is solved by using a single general inventive concept which is characterized by at least partial overlap, synchronization, of a positive voltage pulse applied on an electrically conductive or ferromagnetic tube, wherein in a preferred embodiment an inner surface thereof forms a substrate, and excitation negative voltage pulse is applied on a hollow cathode ignited on a background of high-frequency capacitive discharge. In case of a device, the single general inventive concept is characterized by a technical means which provides the above-mentioned pulses synchronization. In a certain embodiment, the means can be represented by a bipolar voltage source synchronized with direct charge (DC) pulse source using a pulse's control unit.

According to first embodiment, the present invention provides a method of generating a low-temperature plasma in a vacuum chamber comprising a hollow cathode and an electrode, wherein said method comprises the step of:
 ignition of a pulse DC discharge in the hollow cathode on a background of RF capacitive discharge, wherein, the method further comprises the steps of:
 applying a positive voltage pulse on the electrode before ignition of said pulse DC discharge; wherein
 said positive voltage pulse is at least in part overlap with a negative voltage pulse applied on the hollow cathode.

During the period of overlapping of the pulses, a large potential difference exists between the hollow cathode and the electrode, which in some embodiments can be a coating tube. This potential difference allows rapid and reliable ignition of intense discharge between the hollow cathode and the electrode for this short period of time, thus creating transient high density plasma and high ionization of the deposition particles without the arc being discharged. The existence of this dense plasma enables the generation of a stable discharge mode between the hollow cathode and the RF plasma after the end of this positive pulse.

According to the method of the first embodiment, a new and higher effect is achieved which consists of a stable repeatable generation of pulsed plasma with a high concentration of electrons and ions with high ionization of deposition particles, which contribute to the subsequent control of ion bombardment.

In another preferred embodiment of the above-mentioned method, a negative voltage pulse is further applied on the electrode after the positive voltage pulse terminates.

Advantageous effects consist in the fact that the negative pulse on the electrode at this moment accelerates the ions and deposition ions towards to the coating surface, and the energy released from the kinetic energy of these ions after impact on the surface is used locally to crystallize the deposited material and increase its density, thus creating non-porous solid phase having good adhesion to the surface. Due to this kinetic energy, the ionized deposition particles are better embedded in the electrode surface by impact by creating a specific interface at the surface, which will ensure good adhesion of the deposited material.

In some embodiments, low-temperature plasma may be reactive plasma or plasma suitable for steaming, sputtering, implantation, plasma etching, surface modification of materials, but preferably reactive plasma containing reactive particles, excited particles, precursor particles, dust particles or radicals is generated in discharge in the hollow cathode.

In the second embodiment of the present invention, a method of coating of an inner surface of a hollow electrically conductive or ferromagnetic tube by a thin film using a low-temperature plasma generated through discharge in a hollow cathode placed at an electrode end, wherein said method comprises the steps of:
 ignition of a pulse DC discharge in the hollow cathode on a background of RF capacitive discharge, wherein the method further comprises the steps of:
 applying a positive voltage pulse on the coating tube before ignition of said pulse DC discharge, wherein said positive voltage pulse is at least in part overlap with negative voltage pulse on the hollow cathode.

In accordance with the second embodiment of the invention, a new and higher effect is achieved which consists in the growth of a thin film with high adhesion, high density and no macro-particles on the inner surface of the coated tube. This effect is achieved by the synchronized pulse excitation of the discharge and the plasma in the hollow cathode, especially inside the coated electrically conductive or ferromagnetic hollow coated tube, which produces a stable repeatable generation of pulsed plasma with a high concentration of electrons and ions having high ionization of deposition particles as well as a subsequent controlled ion bombardment of the inner surface of the coated ion tube and ionized deposition particles.

The hollow cathode discharge, which is DC pulsed and is ignited on the background of the RF capacitive discharge, is simultaneously present in the entire vacuum chamber, especially inside the coating tube. For this discharge, it acts as a cathode of the nozzle-shaped tube, and as the anode primarily operates the conductive RF plasma present within the coating tube. The DC pulse discharge is thus closed off from the cathode via this RF plasma and further through the grounded wall of the chamber back towards the positive pole of the DC pulse source.

Preferably, a negative voltage pulse is applied to the coating tube upon termination of the positive voltage, more preferably from a bipolar source.

After a certain period of time and after the end of application of the positive pulse on the coating hollow electrically conductive tube, a negative pulse, preferably provided from a bipolar source, allows a defined acceleration of the positive ions and ionized positive deposition particles towards the inner surface of the coating tube where the thin film is grown consisting of these particles with high adhesion and density without macroscopic particles.

In a third embodiment, the invention provides a device for generating a low-temperature plasma comprising:
 a DC pulse source connected in parallel to a RF source;
 an electrode and a hollow cathode placed in a vacuum chamber, wherein the device further comprises:

a bipolar source synchronized with the DC pulse source via a control pulses generator, wherein the electrode is connected to the bipolar source; and the hollow cathode is connected to the RF source and the DC pulse source.

In a fourth embodiment, the invention provides a device suitable for coating of an inner surface of an electrically conductive or ferromagnetic hollow tube by a thin film via low-temperature plasma comprising:

a DC pulse source connected in parallel to a RF source;

an electrode;

a coated tube situated in a vacuum chamber, wherein the device further comprises:

a bipolar source synchronized with the DC pulse source via management pulses generator, wherein the electrode is equipped with a hollow cathode at its end; and the hollow cathode and the coated tube are electrically insulated, preferably the electrode is covered by a dielectric tube; and the coated tube is connected to the bipolar source; and the hollow cathode is connected to the RF source and DC pulse source.

BRIEF DESCRIPTION OF DRAWINGS

Specific embodiments of the methods and devices of the invention are schematically shown in the accompanying drawings, wherein.

Figures illustrating the schematics of the device according to the invention and demonstrating the effects of its use and the following examples of particular embodiments of the device do not in any way limit the scope of protection set forth in the claims but merely illustrate the essence of the invention.

DETAILED DESCRIPTION OF THE EMBODIMENTS

Generating Low-Temperature Plasma: A Method and a Device

Figure 1:
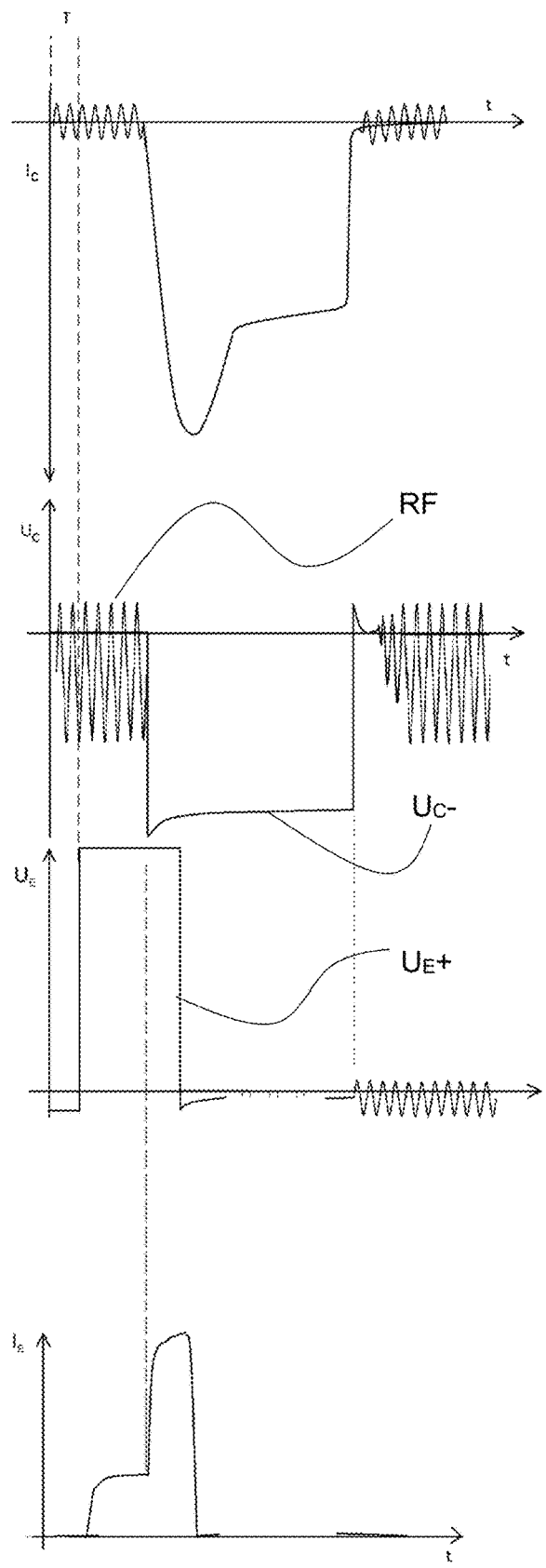
FIG. 1 represents an example of the time overlap of pulsed voltages and currents and their mutual phases of a plasma source with a hollow cathode and an electrode.

In the example carried out according to the first embodiment of the invention, low-temperature plasma 11 is generated in the vacuum chamber 1. The vacuum chamber 1 comprises a hollow cathode 14 and an electrode 21E. The time sequence of the applied voltage $U_E+$ and $U_C-$ and the passing currents through the electrode 21E and the hollow cathode 14 is shown in FIG. 1.

In the first step of the low-temperature plasma generation process 11, the RF frequency capacitive RF voltage generated by the RF source 16 is supplied to the hollow cathode 14. In the second step, a positive voltage pulse $U_E+$, from a bipolar voltage source 20, is supplied to the electrode 21E.

After a certain time $_T$, but at the same time as the positive voltage pulse $U_E+$ is still present on the electrode 21E, a negative voltage pulse $U_C$ is supplied to the hollow cathode 14 by a DC source 18 which generates the low-temperature plasma 11.

During pulse time-overlap, the potential difference between the hollow cathode 14 and the electrode 21E is generated. Within the experiment, a 1 kV potential difference was achieved, with 400V being the difference between the positive voltage pulse and the ground and 600V between the negative voltage pulse and the ground. The potential difference allowed a fast (in units of µs) and reliable ignition of a high ionization discharge between the hollow cathode 14 and the coated tube 21 for this short time (10-50 µs) to form transient high ion- and electron-$10^{12}$ cm$^{-3}$) and high ionization (30-60%) of deposition particles without arcing.

Preferably, a negative voltage pulse $U_E-$ is added to the electrode 21E after the positive voltage pulse $U_E+$ is terminated, which contributes to the bombarding of the surface of the electrode by accelerated positive ions. (The preferred embodiment is to some extent shown in FIG. 3, where $U_{E+}=U_+$, followed by U−)

Figure 2:
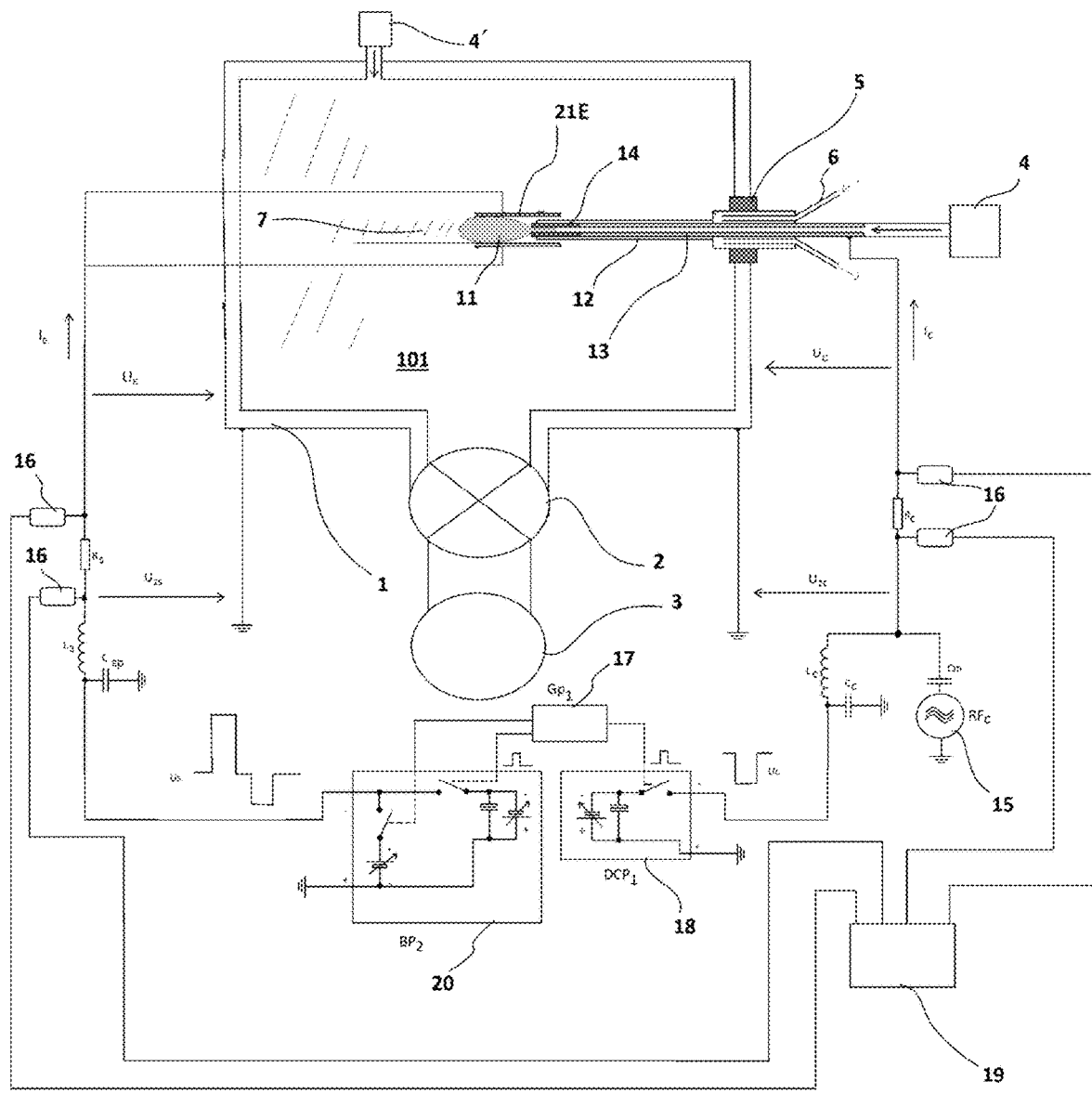
FIG. 2 represents an example of a device for generating pulsed low-temperature plasma.

An example of a device according to the third embodiment of the invention is shown in FIG. 2. The low-temperature plasma generating device comprises a metal vacuum chamber 1 which is preferably separated by a plate valve 2 and pumped by a vacuum pump 3. In the interior of the vacuum chamber 101, the electrode 13 is placed through a dielectric bushing 5 whereby this electrode 13 is preferably provided with water cooling 6. The working gas 4 is supplied to the electrode 13. The electrode 13 is electrically connected to the RFc power source 15, preferably via the separating capacitor $C_m$, and connected in parallel to the DC pulse source 18, preferably through the stabilizing and measuring resistor $R_c$ on which the voltage $U_c$ is measured by a pair of voltage oscilloscopic probes 16 and a LC cell formed by the inductor $L_c$ and the capacitor $C_c$ to the DC pulse source 18 which is controlled by the pulse from the pulse generator 17. In a further preferred embodiment, a pair of oscilloscopic probes 16 is connected to a digital oscilloscope 19. On the digital oscilloscope 19, it is possible to display or store data in digital form, wherein the data may be time course of the $U_c$ supplied on the hollow cathode 14 relative to the ground walls of the vacuum chamber 1 and further the time course of the voltage $U_{zs}$, by which, it is possible to calculate the flow of electric current $I_c$ on the hollow cathode 14 according to the relationship $$I_c = \frac{U_{zs} - U_c}{R_c}. \tag{I}$$

A hollow cathode 14 is connected at the end of the electrode 13, wherein the inner wall of the hollow cathode 14 is sputtered by a DC pulse discharge 11. The discharge in the hollow cathode 14 closes in the initial phase of the working pulse across the electrode 21E.

The initial phase is the time when a positive voltage pulse from the bipolar pulse source 20 is applied to the coated electrically conductive tube 21. In the next working phase of the working pulse, the coating is secured via the RF plasma 7 present in the electrode 21E.

Figure 3:
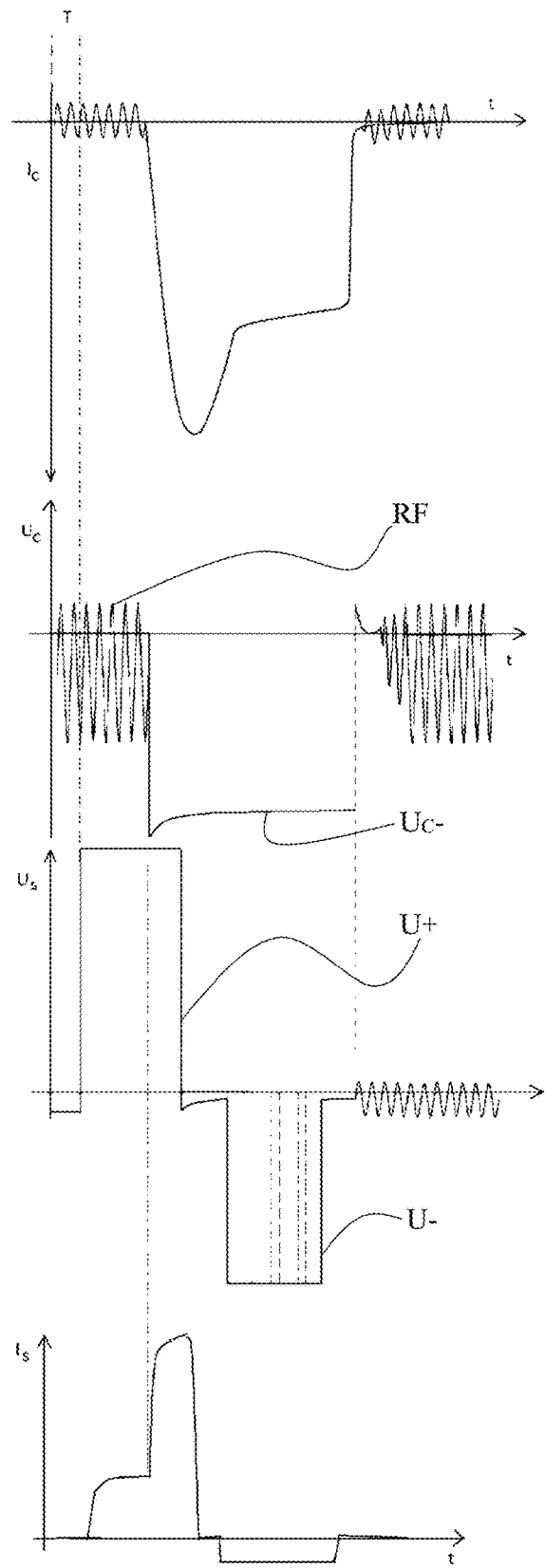
FIG. 3 represents the preferred embodiment of the example of the time behaviour of the pulse voltages and currents and their mutual phase applied on a plasma source having a hollow cathode and an electrically conductive substrate in the shape of a long tube.

Coating of Electrically Conductive and/or Ferromagnetic Low-Temperature Plasma Tubes: Method and Equipment FIG. 3 shows the time courses of the currents and voltages in the periphery of the hollow cathode 14 and the conductive coating tube 21. The embodiment of the device according to the fourth embodiment of the invention is shown on FIG. 4.

In the example carried out according to the second embodiment of the invention, stable plasma formed according to the method described in the example above is utilized. In this example, the electrode 21E is an electrically conductive tube 21 having an internal diameter of 9 mm and a length of 200 mm. In another embodiment, the method can also be used for ferromagnetic tubes.

In the first step of the method of generating low-temperature plasma 7, 11, an alternating voltage RF is generated on the hollow cathode which is generated by the RF source 16. In the second step, a positive voltage pulse U+ is supplied to the coated tube 21 from a bipolar voltage source 20. After a certain time $_T$ but simultaneously at the time the positive voltage pulse U+ is still present on the coated tube 21, a negative voltage pulse $U_C$ is supplied to the hollow cathode 14 with a DC source 18 which generates the low-temperature plasma 11.

Preferably, a negative voltage pulse U− is applied to the coating tube 21 after the positive voltage pulse U+ is terminated.

In another preferred embodiment, the coating tube 21 is cooled by means of water cooling 6.

More preferably, the plasma 7, resp. 11, is stabilized by means of the stabilizing measuring resistor $R_c$ and further through the LC a cell formed by the inductor $L_c$ and the capacitor $C_c$.

More preferably, another working gas is supplied into the inner part 101 of the chamber 1 which is not led through the hollow cathode 14 into the chamber 1. The advantage is that the additional working gas does not contaminate the inner surface of the hollow cathode 14 due to the flowing gas through the internal volume of the hollow cathode 14.

More preferably, the hollow cathode 14 is cooled.

Figure 4:
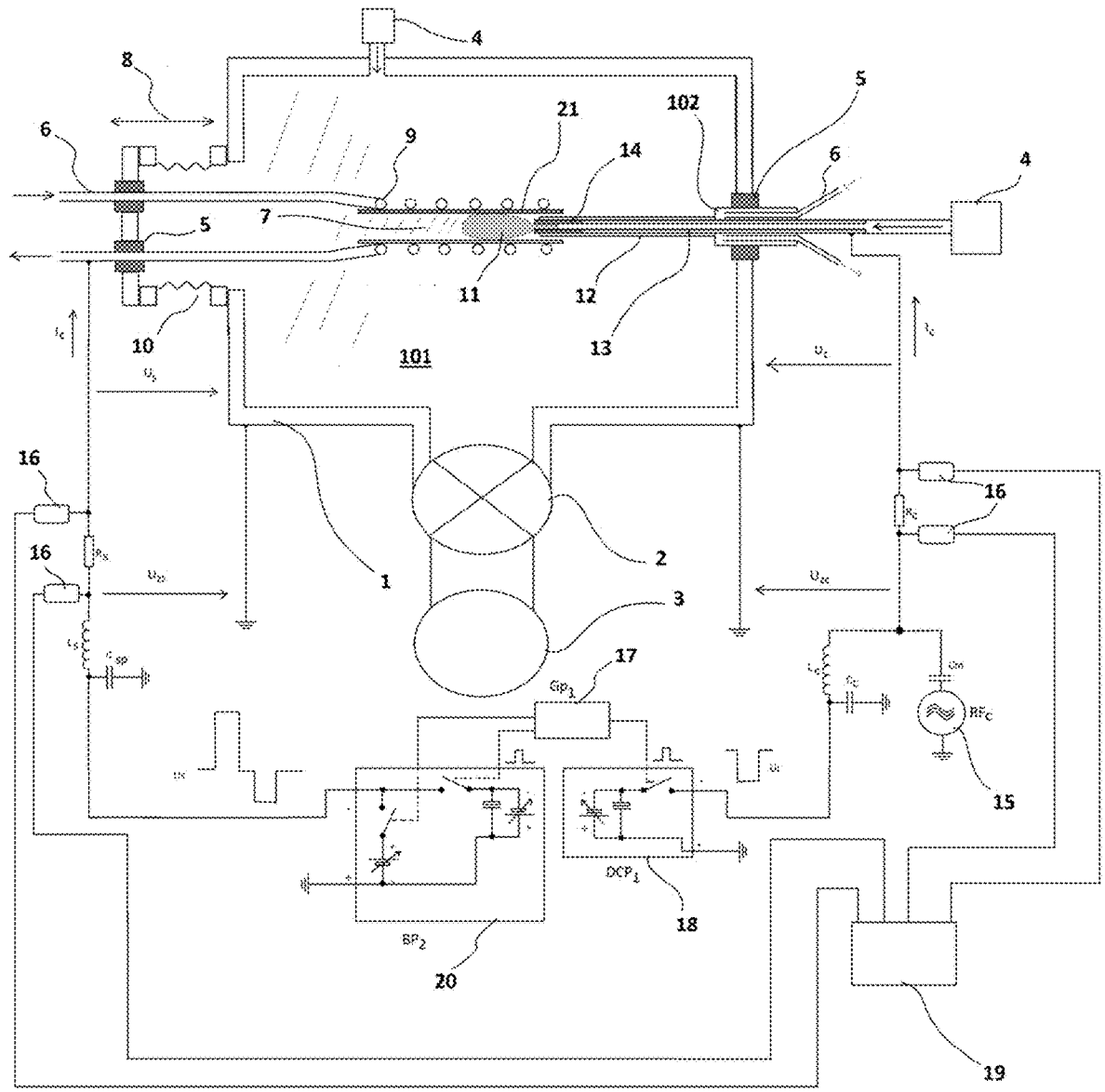
FIG. 4 represents a schematic diagram of the preferred embodiment of a device suitable for pulsed plasma deposition of an adhesive film on the inner surface of an electrically conductive or ferromagnetic tube of any length.

An example of a device according to a fourth embodiment of the invention is shown in FIG. 4. The device suitable for coating the inner surface of hollow electrically conductive or ferromagnetic tubes 21 by means of a low-temperature plasma 11 is a metal vacuum chamber 1 which is preferably separated by a plate valve 2 and pumped by a vacuum pump 3. In the interior space 101 of the vacuum chamber 1, an electrode 13 is located, for example through a dielectric bushing 5, whereby this electrode 13 is preferably equipped with water cooling 6. Through the electrode 13, a working gas 4 is fed into the interior space 101 of the vacuum chamber. The electrode 13 is electrically connected to the RFc power source 15 via the decoupling capacitor $C_m$ and connected in parallel to the DC pulse source 18, preferably via the stabilizing and measuring resistor $R_c$, on which voltage $U_c$ is measured by two voltage oscilloscope probes 16, with an LC cell formed by the inductor $L_c$ and a capacitor $C_c$, the DC pulse source 18 being controlled by the control pulse generator 17. At the end of the electrode 13 the hollow cathode 14 is connected, the inner wall of the hollow cathode 14 is sputtered by a DC pulse discharge 11. The discharge in the hollow cathode 14 closes in the initial phase of the working pulse over the coated electrically conductive or ferromagnetic tube 21 such that the sputtered particles in the plasma 11 reach the surface of the inner wall of the coated tube 21. The initial phase is the time when a positive voltage pulse from the bipolar pulse source 20 is applied to the coated electrically conductive tube 21. In the next working phase of the working pulse, the coating is secured via the RF plasma 7 which is present in the coated tube 21. The hollow cathode 14, together with the carrier electrode 13, is covered by an electrically conductive tube 12 due to the electrical insulation of the hollow cathode 14 and the coated conductive tube 21.

Preferably, the coated tube 21 is in both thermal and electrical contact with the metallic tube cooling 9, preferably water, acting as an electrode, which is attached to the movable bellows 10 provided with a linear movement through the dielectric bushings 5. The bellows 10 is from the walls of the grounded vacuum chamber 1 electrically insulated.

More preferably, the oscilloscope probes 16 are coupled to the digital oscilloscope 19. On the digital oscilloscope 19 it is then possible to display or store in digital form the time course of the $U_c$ voltage on the hollow cathode 14 relative to the ground walls of the vacuum chamber 1 and, it is possible to calculate the course of the electric current Ic by the hollow cathode 14 according to the relationship $$I_c = \frac{U_{zc} - U_c}{R_c}. \quad (I)$$

More preferably, the bipolar pulse source 20 is connected to the condenser 9 via an LC filter formed by the $C_{sp}$ capacitor and the inductor Ls and further to the measuring resistor $R_s$ to which oscilloscopic voltage probes 16 are connected. The flow of the electric current $I_s$ on the coated tube 21 and can be obtained from the measured during the stresses $U_s$ and $U_{zs}$ according to:

$$I_s = \frac{U_{zs} - U_s}{R_s}. \quad (I)$$

More preferably, the opening 4' of the vacuum chamber 1 works as the inlet of further working gas.

INDUSTRIAL APPLICABILITY

The methods and devices according to the invention can be used for the industrial coating of 3D objects, in particular the inner surfaces of electrically conductive tubes with hardly accessible inner coated surface. In a new method and apparatus according to the invention it is possible to coat the internal surfaces of the ferromagnetic tubes.

The invention claimed is:

1. A device for generating a pulsed discharge low-temperature plasma comprising
a DC pulse source connected in parallel to a RF source;
an electrode and a hollow cathode placed in a vacuum chamber,
a bipolar source synchronized with the DC pulse source via a control pulses generator, wherein
the electrode is connected to the bipolar source, wherein the bipolar source is configured to apply a positive voltage pulse on the electrode; and
the hollow cathode is connected to the RF source and the DC pulse source, wherein DC pulse source is configured to initiate a pulse discharge on a background of RF capacity discharge; and wherein
the device is configured to set the positive voltage pulse on the electrode in at least in part overlap with a negative voltage pulse applied on the hollow cathode.

2. A device suitable for coating an inner surface of an electrically conductive or ferromagnetic hollow tube by a thin film via low-temperature plasma comprising the device according to claim 1,
wherein,
the hollow cathode is a coated tube situated in a vacuum chamber,
the electrode is equipped with a hollow cathode at its end; and
the hollow cathode and the coated tube are electrically insulated.

3. The device according to claim 2, wherein the coated tube is attached to a cooling.

4. The device according to claim 3, wherein the cooling is a water cooling.

5. The device according to claim 4, wherein the water cooling is attached to a bellows, wherein the bellows are electrically insulated from sides of the vacuum chamber.

6. The device according to claim 4, wherein the device further comprises at least one oscillography probe connected to a digital oscilloscope and the electrode and/or the water cooling.

7. The device according to claim 4, wherein the water cooling is connected to a low-frequency filter via measuring resistance, wherein the low-frequency filter is consisting of inductor and capacitor with the bipolar pulse source.

8. The device according to claim 2, wherein the vacuum chamber further comprises at least one opening for entrance gas flow.

9. The device according to claim 2, wherein the electrode is equipped with a water cooling.

* * * * *